(12) United States Patent
Chang et al.

(10) Patent No.: US 8,270,173 B2
(45) Date of Patent: Sep. 18, 2012

(54) ELECTRONIC DEVICE WITH LOCKING MODULE

(75) Inventors: Chun-Wei Chang, Taipei Hsien (TW); Jui-Feng Hu, Taipei Hsien (TW); Chang-Ju Wu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 367 days.

(21) Appl. No.: 12/649,302

(22) Filed: Dec. 29, 2009

(65) Prior Publication Data

US 2011/0157779 A1 Jun. 30, 2011

(51) Int. Cl.
*H05K 7/16* (2006.01)
(52) U.S. Cl. ........ 361/726; 361/801; 361/802; 361/803; 361/732; 361/759; 361/679.01; 455/550.1; 455/575.8; 455/90.3
(58) Field of Classification Search .......... 361/801–803, 361/726, 732, 747, 759, 679.01; 455/550.1, 455/575.8, 90.3
See application file for complete search history.

(56) References Cited

U.S. PATENT DOCUMENTS

| | | | | |
|---|---|---|---|---|
| 1,979,560 A | * | 11/1934 | Levine ............................. | 70/66 |
| 5,413,391 A | * | 5/1995 | Clavin et al. .................. | 292/170 |
| 5,416,479 A | * | 5/1995 | Jondrow et al. ................. | 341/20 |
| 5,688,001 A | * | 11/1997 | Klein et al. ..................... | 292/67 |
| 5,918,956 A | * | 7/1999 | Scholder ..................... | 312/223.2 |
| 6,174,007 B1 | * | 1/2001 | Schlack et al. ............. | 292/336.3 |
| 6,362,975 B1 | * | 3/2002 | Liu et al. ........................ | 361/796 |
| 6,616,201 B1 | * | 9/2003 | Liang ............................. | 292/207 |
| 6,824,174 B2 | * | 11/2004 | Lin et al. ......................... | 292/85 |
| 6,957,979 B2 | * | 10/2005 | Welsh et al. .................. | 439/565 |
| 7,201,407 B2 | * | 4/2007 | Schlack ......................... | 292/139 |
| 7,325,846 B2 | * | 2/2008 | Smith et al. ................ | 292/336.3 |
| 7,397,674 B2 | * | 7/2008 | Schlack ......................... | 361/801 |
| 7,441,812 B2 | * | 10/2008 | Welsh et al. .................. | 292/143 |
| 7,614,672 B2 | * | 11/2009 | Smith et al. ................ | 292/336.3 |
| 7,758,133 B2 | * | 7/2010 | Chen et al. .................. | 312/223.2 |
| 2006/0103141 A1 | * | 5/2006 | Schlack et al. ............... | 292/139 |

* cited by examiner

*Primary Examiner* — Hung S Bui
*Assistant Examiner* — James Wu
(74) *Attorney, Agent, or Firm* — Altis Law Group, Inc.

(57) ABSTRACT

An electronic device includes a chassis, a cover on the chassis, a fixing member fixed on the cover and a handling member. A pair of latches are arranged on the chassis and each define a latching hole. The fixing member includes a substrate and a pair of side plates each defining a locking groove. A pair of catches extend upwards from the substrate and each define a locking groove. Cooperatively the locking groove and the latching groove forms a closed groove. The handling member includes a pivot received in the closed groove, and a pair of shafts in the guiding grooves. Firstly, the handling member rotates around the shafts to cause the pivot to engage with the latch, and then rotates into the aperture around the pivot to cause the shafts to move upwards to make the cover moving relative to the chassis to lock with the chassis.

16 Claims, 9 Drawing Sheets

ELECTRONIC DEVICE WITH LOCKING MODULE

BACKGROUND

1. Technical Field

The present disclosure relates to electronic devices, and particularly to a locking module of an electronic device for assembling the electronic device.

2. Description of Related Art

Generally, an electronic device has a shell for accommodating a plurality of electronic components therein. The shell includes a base and a cover detachably assembled on the base. Thus the cover can be disassembled to replace the electronic components when any of the electronic components needs to be replaced. However, conventionally, the cover is assembled to the base using a plurality of screws, which is inconvenient for either assembly or disassembly.

What is need, therefore, is an electronic device which can overcome the above limitations.

DETAILED DESCRIPTION

Figure 1:
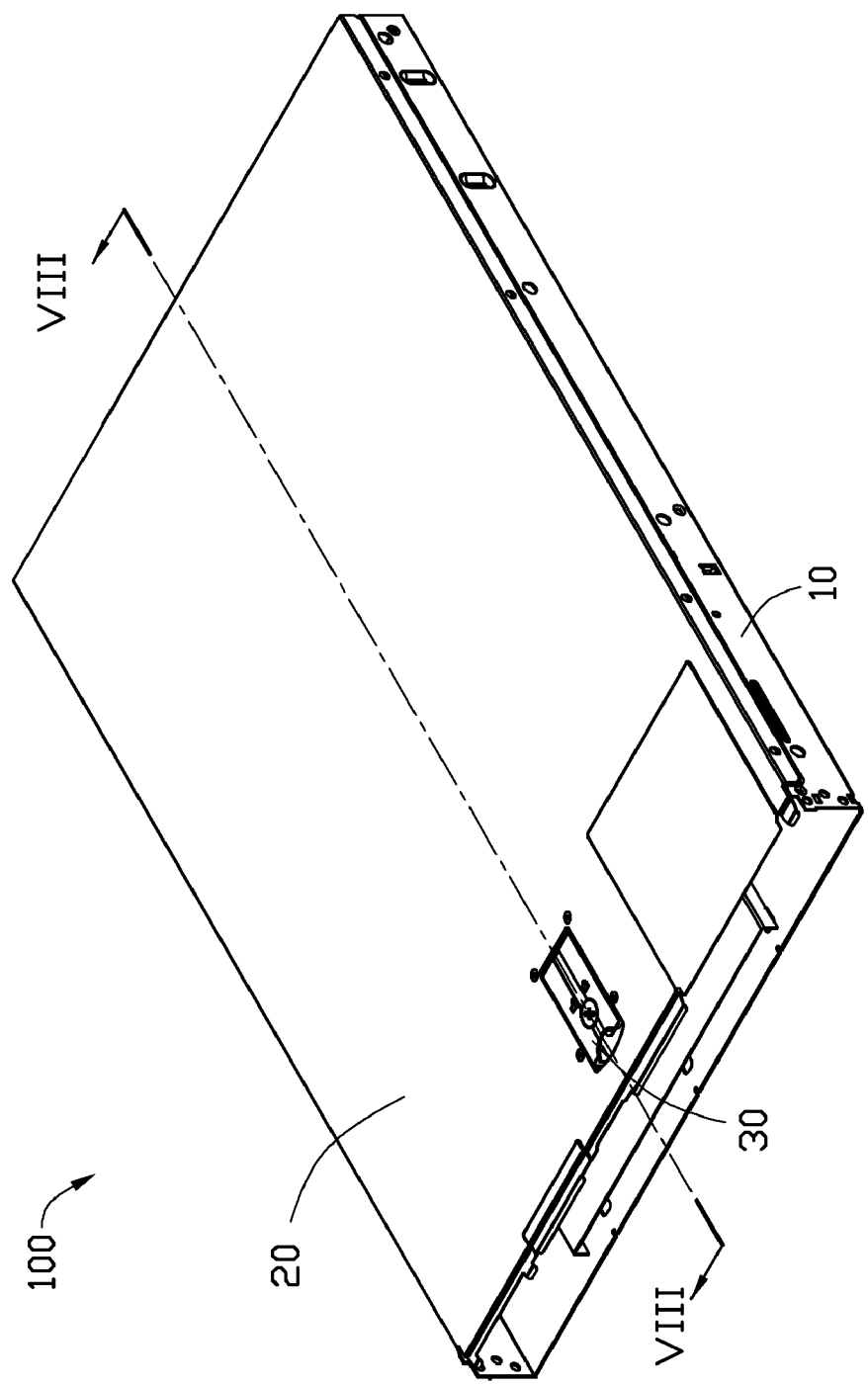
FIG. 1 is an isometric, assembled view of an electronic device according to an exemplary embodiment.
Figure 2:
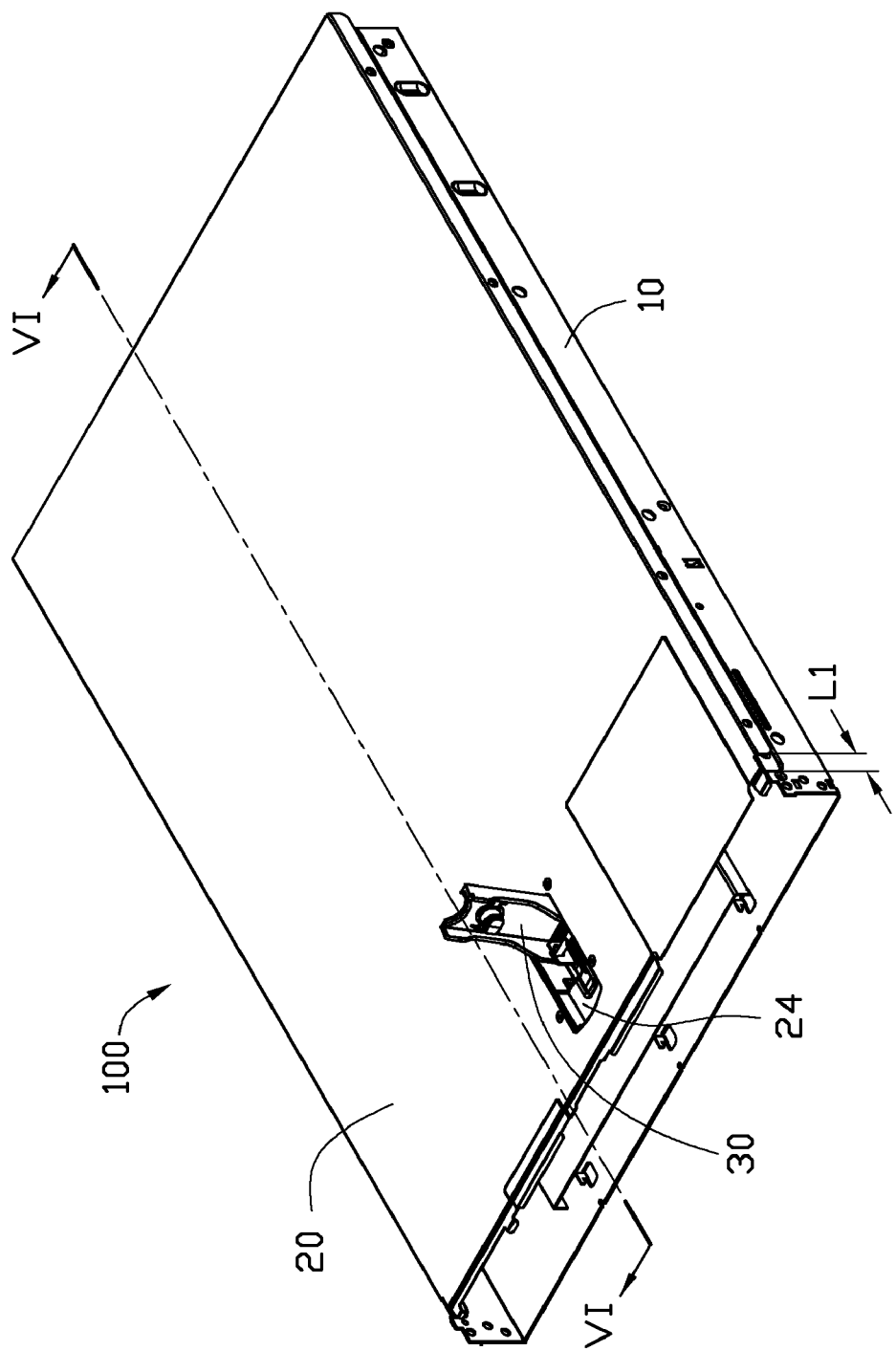
FIG. 2 is similar to FIG. 1, but showing a shell of the electronic device being unlocked.
Figure 3:
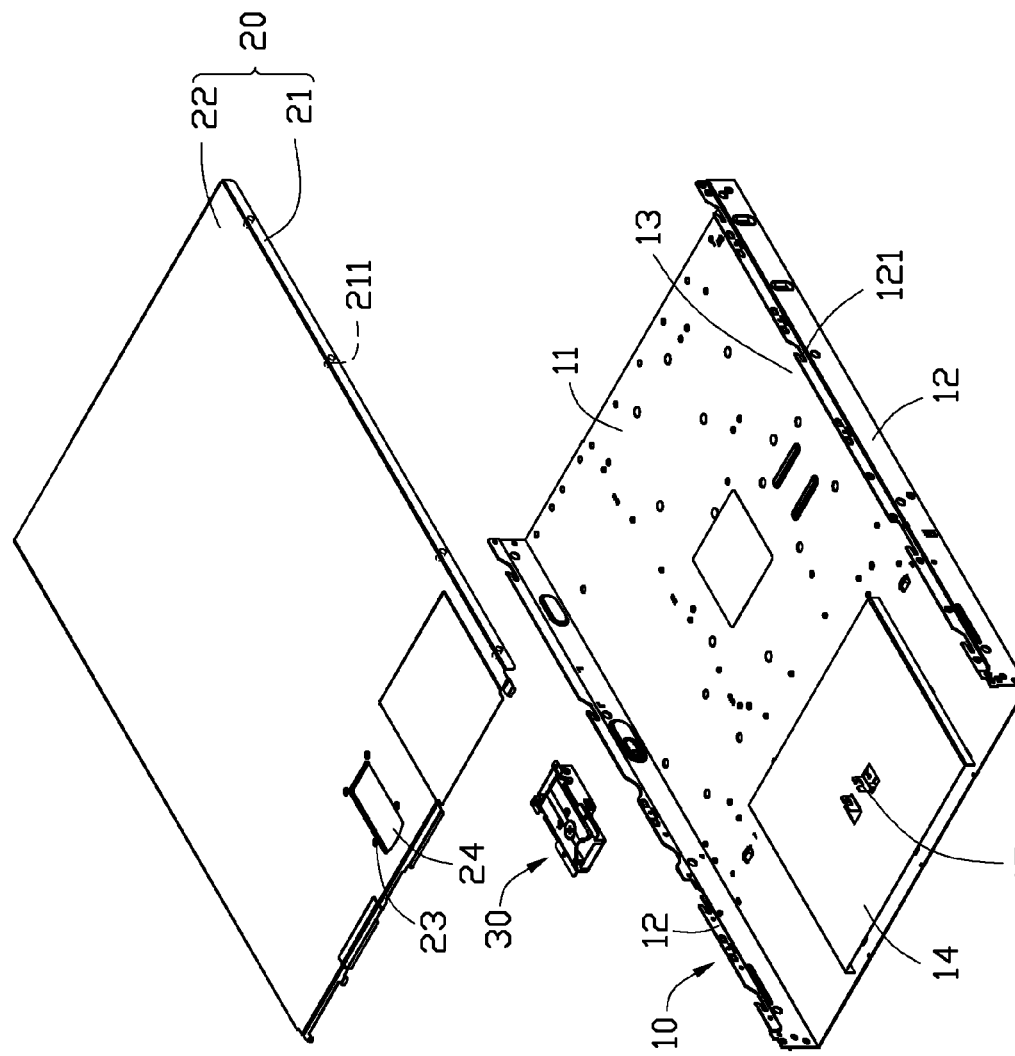
FIG. 3 is an exploded view of the electronic device of FIG. 1.

Referring to FIGS. 1 through 3, an electronic device 100 according to an exemplary embodiment includes a chassis 10, a cover 20, and a locking module 30 for assembling the cover 20 onto the chassis 10. The cover 20 and the chassis 10 cooperatively define a space 13 receiving electronic components therein.

The chassis 10 includes a bottom wall 11 and a pair of side walls 12. The bottom wall 11 is rectangular and elongated. The pair of side walls 12 extend from two longer sides of the bottom wall 11. A limiting groove 121 is defined in a middle of each of the side walls 12. The limiting groove 121 is L-shaped, and extends through a top side of the side wall 12. A mounting board 14 is arranged on the bottom wall 11 of the chassis 10 and located near a front shorter side of the bottom wall 11. A pair of latches 15 extend upwards from the mounting board 14. The latches 15 are parallel to and spaced from each other. A latching groove 151 (see FIG. 6) is defined in each of the latches 15. The latching grooves 151 are L-shaped, and extend through top sides of the latches 15.

The cover 20 includes a top wall 22 and a pair of lateral walls 21. The top wall 22 of the cover 20 is similar to the bottom wall 11 of the chassis 10 in profile and size. The lateral walls 21 extend downwards from opposite longer sides of the top wall 22, respectively. A pole 211 extends perpendicularly and inwards from an inner side of each lateral wall 21 corresponding to the limiting groove 121 of the side wall 12 of the chassis 10. An aperture 24 is defined in the top wall 22 of the cover 20 at a position corresponding to the latches 15. Four bores 23 extend through the top wall 22 of the cover 20. The bores 23 are arranged around the aperture 24.

Figure 4:
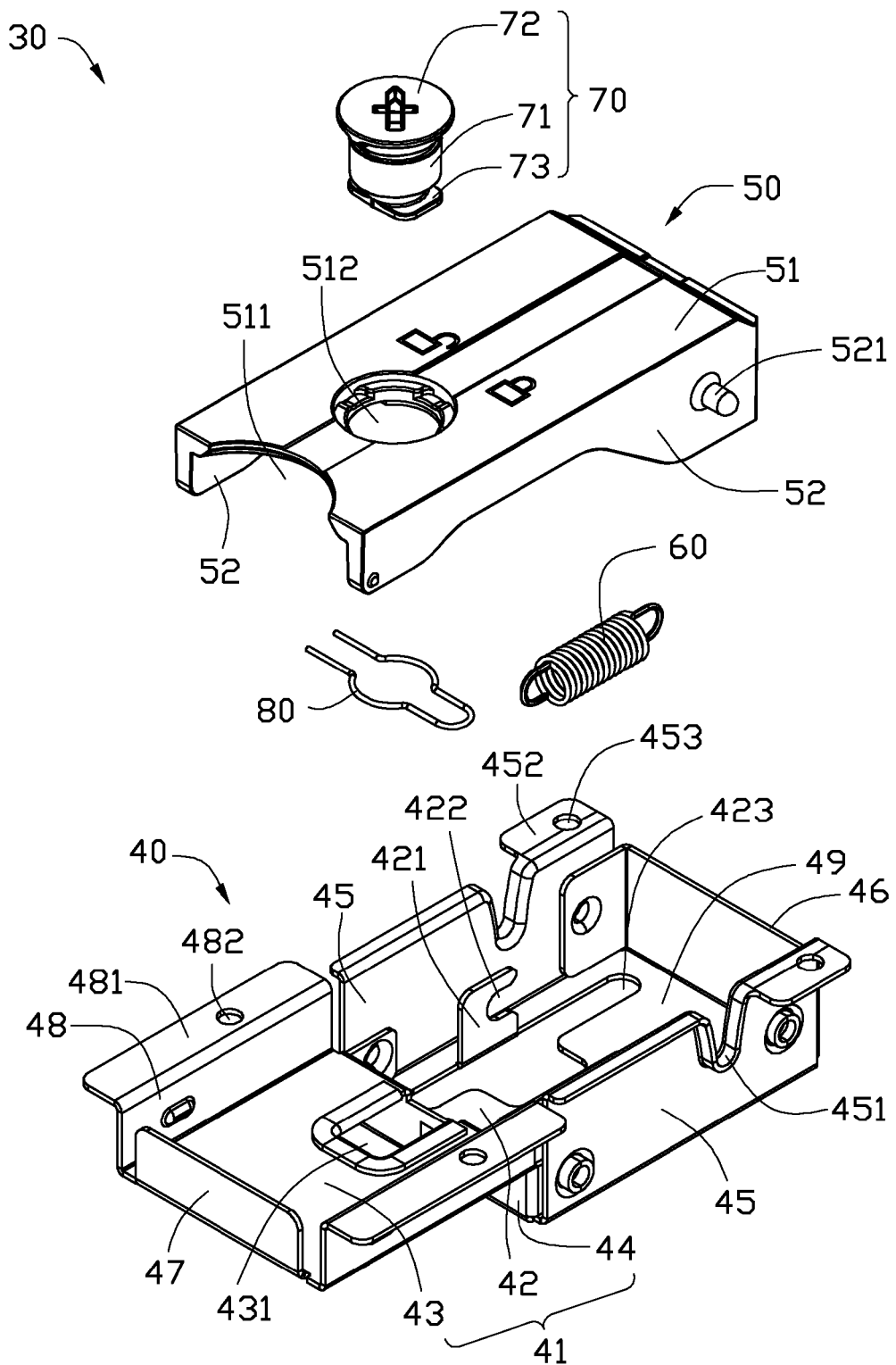
FIG. 4 is an exploded view of a locking module of the electronic device of FIG. 1.
Figure 5:
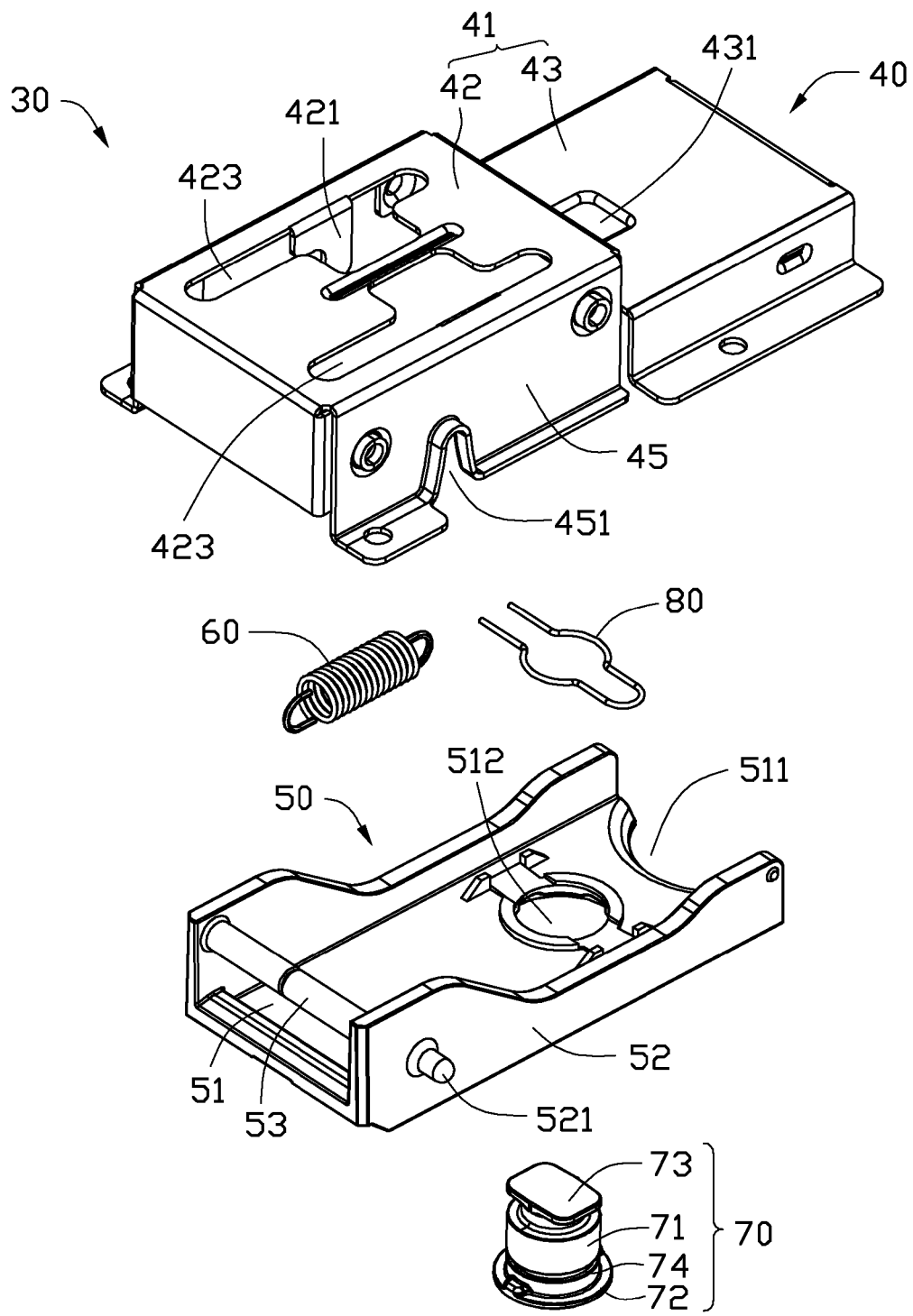
FIG. 5 shows the locking module of FIG. 4 viewed from another aspect.

Referring to FIGS. 4 and 5, the locking module 30 includes a fixing member 40, a handling member 50, a spring 60, a locking member 70 and a clip 80.

The fixing member 40 includes a substrate 41. The substrate 41 includes a first portion 42, a second portion 43, and a connecting portion 44 interconnecting the first portion 42 and the second portion 43. The first portion 42 and the second portion 43 are rectangular. The second portion 43 is higher than the first portion 42, and is arranged parallel to the first portion 42. The connecting portion 44 perpendicularly intersects with inner edges of the first portion 42 and the second portion 43. A pair of end plates 46, 47 extend upwards from outer edges of the first portion 42 and the second portion 43 of the substrate 41, respectively.

A pair of first side plates 45 extend upwards from opposite sides of the first portion 42 of the substrate 41. A guiding groove 451 is defined in each of the first side plate 45. The guiding grooves 451 are V-shaped, and extend through top sides of the first side plates 45. A first flange 452 bents outwards from each of the top sides of the first side plates 45. A first fixing hole 453 is defined in each of the first flanges 452. A pair of catches 421 extends upwards from the first portion 42 of the substrate 41. The catches 421 are parallel to each other, and are formed adjacent to the first side plates 45, respectively. A locking groove 422 is defined in each of the catches 421, and extends through the catch 421 along a longitudinal direction of the fixing member 40. Two opening 423 are defined in the first portion 42 of the substrate 41 between the catches 421 for extension of the latches 15 therethrough.

An engaging hole 431 is defined in the second portion 43 of the substrate 41 at a position adjacent to the connecting portion 44. A pair of second side plates 48 extend upwards from opposite sides of the second portion 43 of the substrate 41 correspondingly. A second flange 481 bents outwards and transversely from each of the top sides of the second side plates 48. A second fixing hole 482 is defined in each of the second flanges 481. The first fixing holes 453 of the first side plates 45 and the second fixing holes 482 of the second side plates 48 are arranged corresponding to the bores 23 of the top wall 22 of the cover 20. The substrate 41, the end plates 46, 47, the first side plates 45, and the second side plates 48 cooperatively define a chamber 49 for receiving the handling member 50.

The handling member 50 includes a rectangular top plate 51 and a pair of lateral plates 52 extending downwards from opposite longer sides of the top plate 51, respectively. A semi-circular shaped cutout 511 is defined at a front shorter side of the top plate 51 for facilitating operation of the handling member 50. A mounting hole 512 is defined in the top plate 51 of the handling member 50 for extension of the locking member 70. The mounting hole 512 is formed corresponding to the engaging hole 431 of the first portion 42 of the substrate 41, and is adjacent to the cutout 511 of the top plate 51.

A pivot 53 interconnects the lateral plates 52 of the handling member 50. The pivot 53 is located adjacent to a rear shorter side of the top plate 51. A shaft 521 extends perpendicularly and outwards from each of the pair of lateral plates 52. The shafts 521 are collinear, and are not coaxial with the pivot 53. In this embodiment, the shafts 521 are higher than the pivot 53, and are closer to the mounting hole 512 relative to the pivot 53.

The locking member 70 includes a column-shaped main body 71, a head 72 formed at a top of the main body 71, and an engaging end 73 formed at a bottom of the main body 71. The head 72 is wider than the main body 71 of the locking member 70. An circular notch 74 is defined in the main body 71 at a position adjacent to the head 72 for engaging the clip 80.

When being assembled, firstly, the locking member 70 is locked on the handling member 50 by the clip 80. The main body 71 of the locking member 70 extends downwards through the mounting hole 512 of the top plate 51, and the head 72 of the locking member 70 abuts the top plate 51 at a periphery of the mounting hole 512. The clip 80 engages in the notch 74 of the locking member 70 to hold the locking member 70 on the handling member 50. The handling member 50 with the locking member 70 is then arranged into the chamber 49 of the fixing member 40 with the shafts 521 of the lateral plates 52 received in the guiding grooves 451 of the first side plates 45 of the fixing member 40, and the pivot 53 received in the locking grooves 422 of the catches 421 of fixing member 40. Then one end of the spring 60 is connected to the connecting portion 44 of the substrate 41 of the fixing member 40, and the other end of the spring 60 is connected to the pivot 53. Preferably, a length of the spring 60 at normal is slightly shorter than a distance between the connecting portion 44 and the locking groove 422, thus the pivot 53 is limited in the locking grooves 422 of the catches 421 by the spring 60 which deforms slightly to apply a pulling force on the pivot 53. Thus the handling member 50 and the fixing member 40 are assembled together.

Then the handling member 50 and the fixing member 40 together are arranged under the top wall 22 of cover 20 with the first fixing holes 453 and the second fixing holes 482 of the fixing member 40 aligned with the bores 23 of the top wall 22, thus screws can extend through the bores 23 to engage with the first and second fixing holes 482 to assemble the handling member 50, and the fixing member 40 to the cover 20. In such a state, the handling member 50 is located in the aperture 24 and can rotate out of the aperture 24.

Figure 6:
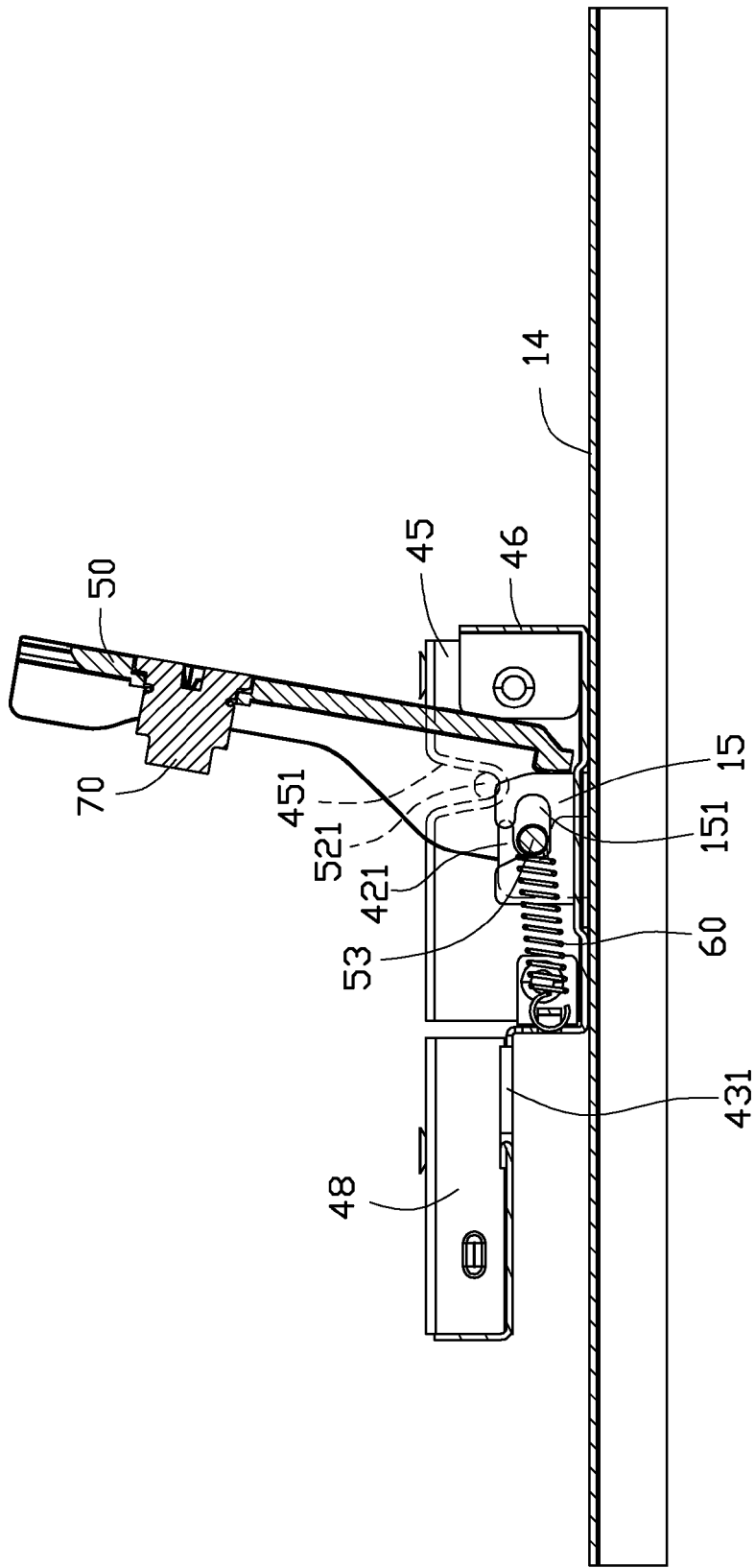
FIG. 6 is a cross section view of the electronic device, taken along line VI-VI of FIG. 2.

Referring to FIGS. 2 and 6, in assembling the cover 20 to the chassis 10, firstly, the cover 20 with the handling member 50 and the fixing member 40 is arranged on the chassis 10 and offset from the chassis 10 with a narrow distance L1. The poles 211 of the lateral plates 21 slide into the limiting grooves 121 of the side walls 12 of the chassis 10, and the latches 15 of the mounting board 14 extend through the opening 423 of the first portion 42 of the substrate 41. The latches 15 are located between the catches 421, and adjacent to the catches 421. Each locking groove 422 of the catch 421 and the corresponding latching groove 151 of the latch 15 face each other, and cooperatively form a closed groove to avoid escaping of the pivot 53. The handling member 50 of the locking module 30 is rotated to be substantially perpendicular to the top wall 22 of the cover 20. In such a state, the pivot 53 engages the catches 421.

Figure 7:
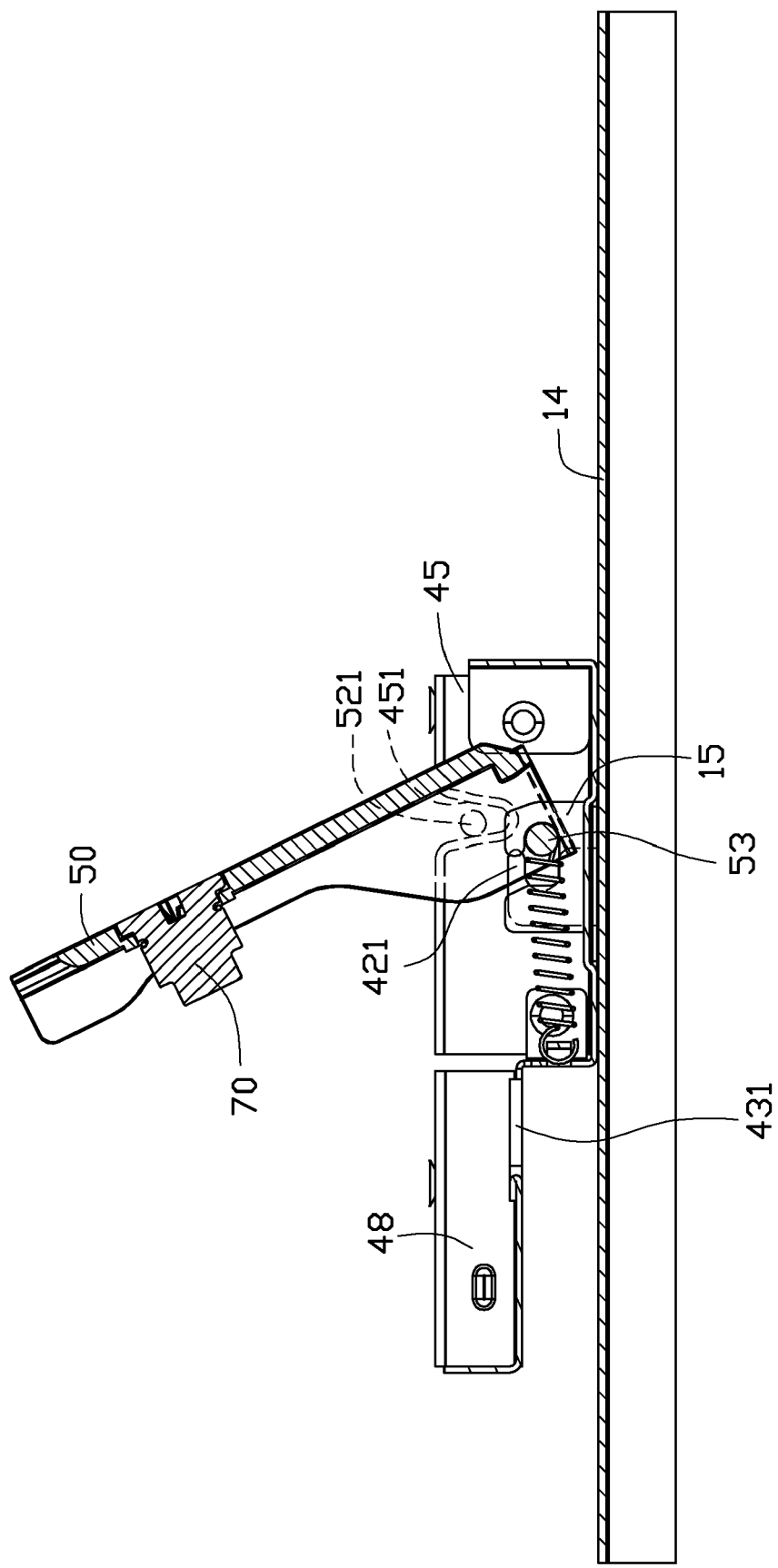
FIG. 7 is similar to FIG. 6, but showing the locking module being rotated to engage with a chassis of the electronic device.

Then a force is applied on the handling member 50 to cause the handling member 50 to rotate anti-clockwise around the shafts 521 received in the guiding grooves 451 of the fixing member 40. Firstly, the pivot 53 moves transversely into the latching grooves 151 and engages with the latches 15 since the pivot 53 limited by the latches 15 and the catches 421, and can not move upwards. Referring to FIG. 7, the handling member 50 rotates around the pivot 53 after the pivot 53 moves to abut the catches 421 for limiting the latches 15. In such a state, referring to FIG. 9, the shafts 521 in the guiding grooves 451 move upwards during rotation of the handling member 50 along the broken line A, and cause the fixing member 40 moves frontwards. The movement of the fixing member 40 causes the cover 20 to move frontwards relative to the chassis 10 since the fixing member 40 and the top wall 22 of the cover 20 are assembled together by screws.

Figure 8:
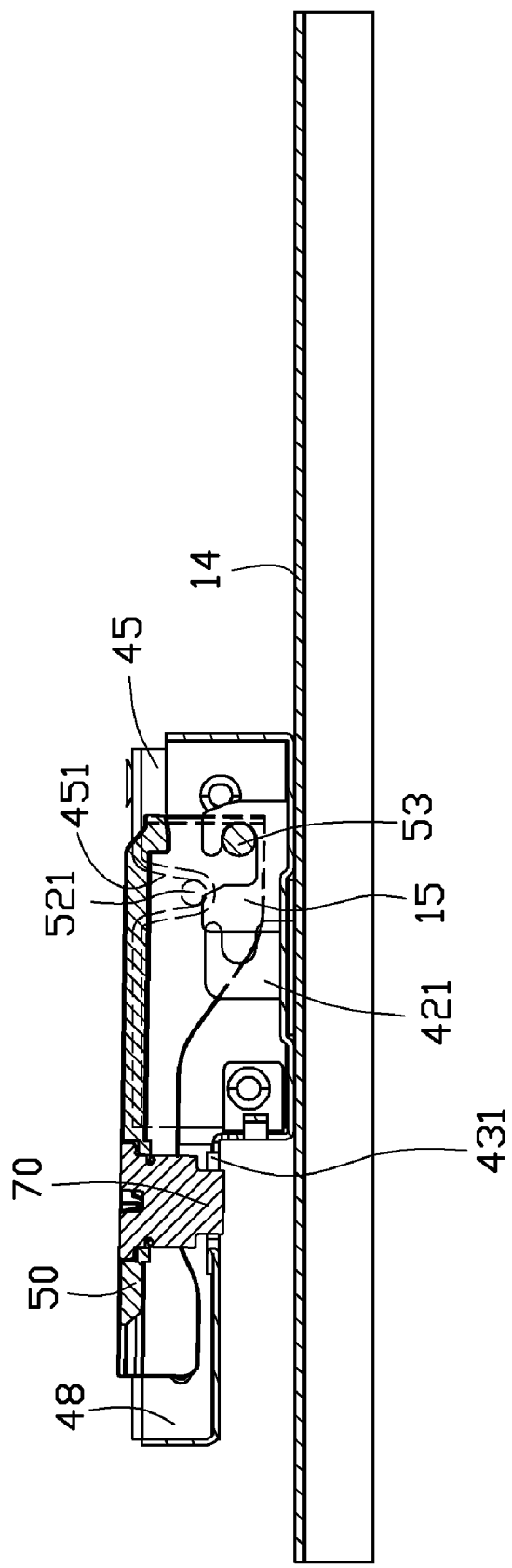
FIG. 8 is a cross sectional view of the electronic device, taken along line VIII-VIII of FIG. 1.
Figure 9:
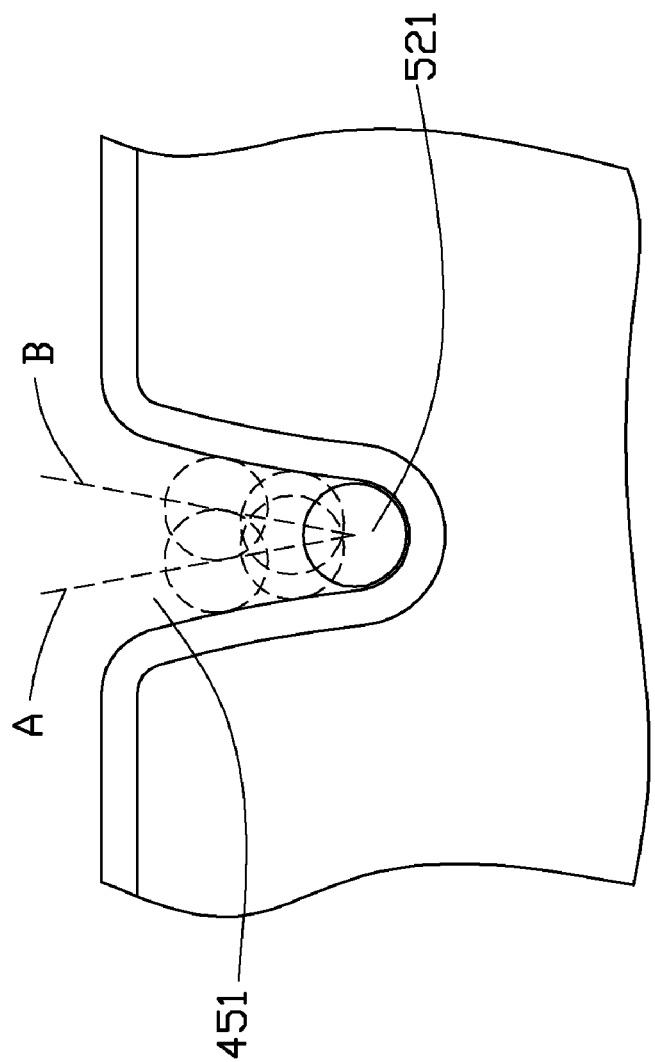
FIG. 9 is a schematic view showing different tracks of shafts of the locking module during assembly and disassembly of the electronic device.

Referring to FIGS. 1 and 8, when the handling member 50 is rotated to be received in the aperture 24 of the top plate 51 of the cover 20, the cover 20 is moved to overlap with the chassis 10, and the poles 211 of the cover 20 are engaged in the limiting grooves 121 to assemble the cover 20 and the chassis 10 together. Finally, the engaging end 73 of the locking member 70 is rotated to engage into the engaging hole 431 of the second portion 43 of the substrate 41 to enhance a stability of the electronic device 100. Thus the cover 20 is locked onto the chassis 10. When the cover 20 needs to be disassembled, firstly the engaging end 73 of the locking member 70 is rotated out of the engaging hole 431 of the substrate 41, and then the handling member 50 is rotated clockwise to cause the cover 20 to move backwards. Thus the poles 211 of the cover 20 can be freed from the limiting grooves 121 of the chassis 10, and accordingly, the cover 20 can be taken away from the chassis 10. For the guiding grooves 451 are V-shaped, a track of the shafts 521 of the locking module 30 during disassembly of the cover 20 which is indicated as broken line B in FIG. 9 is different from the track of the shafts 521 during assembly of the cover 20 which is indicated as broken line A. Thus rotation of the handling member 50 is easy, and assembly or disassembly of the cover 20 is convenient.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. An electronic device, comprising:
a chassis comprising a latch defining a latching groove therein;
a cover arranged on the chassis and defining an aperture therein, a space being defined between the chassis and the cover; and
a locking module for assembling the cover to the chassis, the locking module comprising a fixing member and a handling member, the fixing member being received in the space and fixed on the cover at a position around the aperture, the fixing member defining a locking groove and a pair of guiding grooves, the handling member comprising a pivot received in the locking groove and a pair of shafts received in the guiding grooves, respectively;
Wherein the handling member rotates around the shafts to cause the pivot to move from the locking groove to the latching groove to engage with the latch, and then the handling member rotates to the aperture of the cover around the pivot to cause the shafts to move upwards to make the cover to move relative to the chassis to lock the cover to the chassis; wherein the fixing member comprises a substrate, the substrate comprises a first portion, a second portion and a connecting portion interconnecting the first portion and the second portion, a catch extending upwards from the first portion, the locking groove being defined in the catch.

2. The electronic device of claim 1, wherein the each of the guiding grooves is V-shaped.

3. The electronic device of claim 1, wherein the handling member comprises a top plate and a pair of lateral plates extending downwards from opposite sides of the top plate, the pivot interconnects the lateral plates, and the shafts extend outwards from the pair of lateral plates, respectively.

4. The electronic device of claim 1, wherein the locking groove and the latch groove face each other, and cooperatively define a closed groove to limit movement of the pivot.

5. The electronic device of claim 1, wherein a pair of first side plates extend upwards from opposite sides of the first portion of the substrate, respectively, the guiding grooves are defined in the first side plates, respectively, and the locking groove is closer to the connecting portion of the substrate relative to the guiding grooves.

6. The electronic device of claim 1, further comprising a locking member extending through the handling member and detachably engaging in the first portion of the substrate.

7. The electronic device of claim 1, further comprising a spring, one end of the spring fixed to the connecting portion of the substrate, the other end of the spring fixed to the pivot of the handling member.

8. The electronic device of claim 1, wherein a limiting groove is defined in the chassis, and a pole extends from the cover and engages in the limiting groove when the cover is locked on the chassis by the locking module.

9. An electronic device, comprising:
 a chassis having a bottom wall and a pair of latches arranged on the bottom wall, each latch defining a latching groove therein;
 a cover mounted on the chassis and defining an opening therein;
 a fixing member fixed on the cover, the fixing member comprising a substrate and a pair of side plates extending upwards from opposite sides of the substrate, a guiding groove being defined in each of the side plates, a pair of catches extending upwards from the substrate, each catch defining a locking groove facing the latching grooves, cooperatively each locking groove and a corresponding latching groove defining a closed groove; and
 a handling member arranged in the fixing member, the handling member comprising a top plate, a pair of lateral plates extending downwards from opposite sides of the top plate, a pivot interconnecting the lateral plates and received in the closed groove, and a shaft extending outwards from each of the lateral plates into the guiding groove;
 wherein firstly the handling member rotates around the shafts to cause the pivot to move along the closed groove to engage with the latch, and then the handling member rotates to the aperture of the cover around the pivot to cause the shafts to move upwards to make the cover moving relative to the chassis to lock with the chassis.

10. The electronic device of claim 9, wherein the each of the guiding grooves is V-shaped.

11. The electronic device of claim 9, wherein a flange extend outwards from each of the sidewalls and is fixed on the top wall of the cover at a position around the aperture.

12. The electronic device of claim 9, wherein the substrate comprises a first portion, a second portion higher than the first portion and a connecting portion perpendicularly intersecting with the first portion and the second portion, the catches being formed on the first portion and closer to the second portion relative to the guiding grooves.

13. The electronic device of claim 12, further comprising a locking member extending through the handling member to engage with the first portion of the substrate.

14. The electronic device of claim 12, further comprising a spring with one end fixed to the connecting portion of the substrate and the other end fixed to the pivot of the handling member.

15. The electronic device of claim 9, wherein a limiting groove is defined in the chassis, and a pole extends from the cover and engages in the limiting groove when the cover is locked on the chassis.

16. The electronic device of claim 9, wherein the pivot and the shaft are not coaxial.

* * * * *